(12) United States Patent
Chen et al.

(10) Patent No.: US 6,821,818 B2
(45) Date of Patent: Nov. 23, 2004

(54) METHOD OF ASSEMBLING A SEMICONDUCTOR DEVICE INCLUDING SWEEPING (WITH A SQUEEGEE) ENCAPSULANT OVER THE DEVICE REPEATEDLY

(75) Inventors: Kai-Chi Chen, Nantou (TW); Hsun-Tien Li, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 21 days.

(21) Appl. No.: 10/619,334

(22) Filed: Jul. 14, 2003

(65) Prior Publication Data
US 2004/0180472 A1 Sep. 16, 2004

(30) Foreign Application Priority Data
Mar. 14, 2003 (TW) .................................... 92105582 A

(51) Int. Cl.$^7$ .................. H01L 21/44; H01L 21/48; H01L 21/50
(52) U.S. Cl. .................. 438/112; 438/124; 438/126
(58) Field of Search .................. 438/112, 124, 438/126

(56) References Cited
U.S. PATENT DOCUMENTS

| | | | |
|---|---|---|---|
| 5,832,600 A | * 11/1998 | Hashimoto | 29/841 |
| 5,834,339 A | 11/1998 | Distefano et al. | 438/125 |
| 6,000,924 A | 12/1999 | Wang et al. | 425/125 |
| 6,046,076 A | 4/2000 | Mitchell et al. | 438/127 |
| 6,107,123 A | 8/2000 | Distefano et al. | 438/125 |
| 6,187,613 B1 | 2/2001 | Wu et al. | 438/103 |
| 6,255,142 B1 | 7/2001 | Babiarz et al. | 438/126 |
| 6,579,748 B1 | * 6/2003 | Okuno et al. | 438/124 |
| 6,645,793 B2 | * 11/2003 | Fujii et al. | 438/127 |

* cited by examiner

Primary Examiner—William M. Brewster
(74) Attorney, Agent, or Firm—Quintero Law Office

(57) ABSTRACT

A method of assembling a semiconductor device forming an encapsulant. The method includes providing a substrate having a plurality of semiconductor devices, respectively connecting a semiconductor chip electrically to a predetermined encapsulation area on a surface of the substrate, filling an encapsulant overlying the predetermined encapsulation area using stencil printing, sweeping excess encapsulant over the predetermined encapsulation area at a first air pressure below approximately 1 atm, sweeping encapsulant overlying the predetermined encapsulation area over the encapsulant overlying the predetermined encapsulation area using stencil printing at a second air pressure above the first air pressure, and hardening the encapsulant at a third air pressure above approximately 1 atm.

20 Claims, 16 Drawing Sheets

METHOD OF ASSEMBLING A SEMICONDUCTOR DEVICE INCLUDING SWEEPING (WITH A SQUEEGEE) ENCAPSULANT OVER THE DEVICE REPEATEDLY

BACKGROUND OF THE INVENTION

1. Field of the Invention

The present invention relates to a method of assembling a semiconductor device, and more specifically to a method of assembling a semiconductor device forming an encapsulant.

2. Description of the Related Art

Referring to FIG. 1A, a plurality of semiconductor devices fabricated using conventional flip chip technology are shown. Substrate 100a has a plurality of packaging units 112a for assembling a plurality of the semiconductor devices. In FIG. 1A, as the name implies, flip chip technology is characterized by flipping over a semiconductor chip 10a for attachment to a substrate, through conductive bumps 12a. However, as is known, significant strain is imposed on the conductive bumps 12a during temperature cycling, when an organic material is used as the substrate. This strain results from the significant difference between the coefficient of thermal expansion between the organic substrate (14–17 ppm/° C.) and the silicon wafer (4 ppm/° C.). Consequently, the conductive bumps 12a deteriorate over time at an accelerated rate.

Therefore, to reduce this connection strain and enhance reliability, encapsulant 120a is usually filled into the space between the substrate 100a and the semiconductor chip 10a. In this way, stress is dispersed to the encapsulant to alleviate stress on the conductive bumps 12a. Thus, connection cracking is significantly reduced, and the life of the conductive bumps 12a is prolonged. In addition, the encapsulant 120a also prevents the transmission of leakage current caused by impurities between the conductive bumps 12a. Statistical data shows that the reliability of the device can be increased five to ten times when underfill encapsulation is utilized. Therefore, underfill encapsulation has become a highly important process. However, there are problems that arise in connection with the various ways of performing the underfilling process.

Conventionally, most flip chip packages are encapsulated by dispensing a liquid encapsulant with low viscosity along the periphery of the chip. Capillary action, generated from the encapsulant in the narrow space between the chip and the substrate, drives the encapsulant to fill the gap between the solder connections. Since filling is conducted by capillary action, it is very slow. For example, in a typical encapsulation operation, the filling takes several minutes to several tens of minutes depending on the filling temperature and chip size. Further, one encapsulating apparatus can only encapsulate a single chip in one run dispensing a liquid encapsulant with low viscosity along the periphery of the chip. The throughput per encapsulating apparatus is very low. Many encapsulating apparatuses are therefore necessary for mass production, negatively affecting the production cost. Furthermore, since capillary action alone is insufficient to fill all the space between the chip and the substrate, voids are easily formed in the encapsulant. Such voids require the flip chip package to be discarded from either popcorn effect, caused during subsequent thermal processes, or stress concentration, caused when the flip chip package is stressed.

Referring to FIG. 1B, a plurality of semiconductor devices fabricated using conventional wire-bonding technology are shown. Substrate 100b has a plurality of packaging units 112b for assembling a plurality of the semiconductor devices. Semiconductor chips 10b are respectively attached to packaging units 112b and connect to substrate 100b using wires 12b. Semiconductor chips 10b and wires 12b are covered by a molding compound 120b. Further, another package type, tape automatic bonding (TAB), may be produced when a substrate with a plurality of pre-formed leads (not shown) is used rather than the substrate 100b and wires 12b.

When the semiconductor devices fabricated using conventional wire-bonding or TAB technology are encapsulated using a liquid encapsulant, a plurality of semiconductor devices can be encapsulated at the same time, but voids are still easily formed in the encapsulant.

Referring to FIG. 1C, a plurality of semiconductor devices of multi-chip module (MCM) type fabricated using stacked-die technology are shown. Substrate 100c has a plurality of packaging units 112c for assembling a plurality of the semiconductor devices. Semiconductor chips 10c are respectively attached to every packaging unit 112c and electrically connect to substrate 100c through conductive bumps 12c. Semiconductor chips 10d are respectively attached to and stacked overlying each semiconductor device 10c and electrically connect to substrate 100c through wires 12d. Spaces between the substrate 100c and semiconductor chips 10c are filled by underfill 120c. Semiconductor chips 10d, wires 12d, and underfill 120c are covered using a molding compound 120d. Further, a substrate with both flip chip and TAB type (not shown) may be provided rather than the substrate 100c, using a plurality of leads (not shown) electrically connecting the substrate and semiconductor chips 10d.

The semiconductor device of MCM type shown in FIG. 1C faces challenges in process complexity, process yield, and product reliability resulting from using a plurality of assembling technologies such as flip chip, wire-bonding, and TAB. The aforementioned problems in flip chip package, wire-bonding package, and TAB package will occur at the same time when fabricating the semiconductor device of MCM type. Compared to the semiconductor device fabricated using other assembling technologies, there is further an interface between the underfill 120c and molding compound 120d, a negative factor affecting the process yield and product reliability of the semiconductor device of MCM type.

Solutions for the void in the encapsulant of the semiconductor device have been disclosed. U.S. Pat. Nos. 5,834,339 and 6,107,123 respectively disclose a method characterized as sealing a gap between a chip and a substrate with a fluid, curable encapsulant using the application of a uniform pressure such as an isostatic or hydrostatic pressure thereto for removal of voids and gas bubbles in the encapsulant. However, the encapsulant is still provided by dispensing, so encapsulating cycle time cannot be improved. Further, an extra tooling is necessary to control the encapsulant flow when applying the uniform pressure, negatively affecting the production cost. Furthermore, the method can only be used in the underfill process. U.S. Pat. No. 6,000,924 discloses a method and device providing a special mold to surround a chip to be encapsulated in a cavity, with an encapsulant injected into the cavity at an elevated pressure, and possibly at an elevated temperature. However, the mold must be specially designed to match the size of the chip to be encapsulated, negatively affecting production cost. Further, the mold still can only encapsulate a single chip in one run, thus the throughput of the mold is not improved. U.S. Pat. No. 6,187,613 discloses a process placing a metal foil on a flip chip that has been connected to a substrate, then applying downward pressure to the metal foil so as to form space between the metal foil, flip chip, and substrate, and filling an encapsulant into the space under pressure. The metal foil is about 0.01 mm to 0.1 mm thick and can withstand an encapsulating pressure exceeding 100 psi. However, the encapsulant is still provided by dispensing, so encapsulating cycle time cannot be improved. Further, the metal foil is very expensive and may be deformed under pressure, negatively affecting the uniformity of the sizes of the encapsulated flip chips. Furthermore, the process still can only encapsulate a single chip in one run, thus the throughput is not improved.

U.S. Pat. No. 6,046,076 discloses a method of encapsulating a microelectronic assembly applying a flowable encapsulant to the assembly while maintaining the assembly at sub-atmospheric pressure, then bringing the assembly to a higher pressure after completion of the encapsulant-applying step and holding the assembly at the higher pressure, and curing the encapsulant after bring the assembly to the higher pressure. However, the encapsulant is still provided by dispensing, so encapsulating cycle time cannot be improved. Further, the dispensing volume of the encapsulant must be exactly controlled, or the encapsulant can flood the apparatus. Although a mold chest specially matching the size of the assembly can be provided for preventing encapsulant flooding, the production cost is negatively affected. U.S. Pat. No. 6,255,142 discloses a method and apparatus providing a removable seal to encapsulate a semiconductor device therein. The method further provides a pressure differential to fill an encapsulant in a gap between the semiconductor device and a substrate used therewith. The pressure differential is formed using a vacuum source. However, the encapsulant is still provided by dispensing, so encapsulating cycle time cannot be improved. Further, the gap cannot be completely filled only using the pressure differential. Furthermore, the application of the removable seal is not suitable for mass production. U.S. Pat. No. 6,255,142 discloses a method including evacuating a first chamber, placing a semiconductor chip package into a second chamber at atmosphere, evacuating the second chamber and moving the semiconductor chip package to the evacuated first chamber, dispensing an encapsulant material about the periphery of the semiconductor chip package in the evacuated first chamber, evacuating a third chamber, transporting the encapsulated semiconductor chip package from the first chamber into the evacuated third chamber, and vending the third chamber to atmosphere to force the encapsulant material into the semiconductor chip package. However, the encapsulant is still provided by dispensing, so encapsulating cycle time cannot be improved. Further, when a plurality of semiconductor chip packages is encapsulated at the same time using this method, not only is throughput low, but the encapsulating procedure is slow and complicated. Furthermore, the encapsulant cannot completely fill the gap between the semiconductor chip and substrate of the semiconductor chip package at atmosphere.

As mentioned, none of the aforementioned disclosures perfectly meet the requirements of encapsulating a plurality of semiconductor devices at the same time, preventing voids in the semiconductor devices, completely covering the semiconductor chip specifically for encapsulating the semiconductor device (underfill) of flip chip type, and sustaining compatibility with all assembly technologies, such as flip chip, wire-bonding, TAB, and others.

SUMMARY OF THE INVENTION

Thus, objects of the present invention are to provide a method of assembling a semiconductor device forming an encapsulant, the method allowing a plurality of semiconductor devices to be encapsulated at the same time, preventing voids in the semiconductor device, completely covering the chip when encapsulating the semiconductor device, specifically with flip-chip semiconductor devices, the method further supporting compatibility with all assembly technologies, such as flip chip, wire-bonding, TAB, and others, thereby improving production yield, reliability, lifetime, and throughput of the semiconductor device, and reducing the cost of encapsulating apparatus.

In order to achieve the exceeding objects, the present invention provides a method of assembling a semiconductor device forming an encapsulant. First, a substrate, having a plurality of semiconductor devices, respectively having a semiconductor chip electrically connected to a predetermined encapsulation area on a surface of the substrate is provided. Next, an encapsulant is filled overlying the predetermined encapsulation area using stencil printing, sweeping excess encapsulant over the predetermined encapsulation area at a first air pressure less than approximately 1 atm. Further, encapsulant overlying the predetermined encapsulation area is swept over the predetermined encapsulation area using stencil printing at a second air pressure exceeding the first air pressure. Finally, the encapsulant is hardened at a third air pressure exceeding approximately 1 atm.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiments and examples are intended to illustrate the invention more fully without limiting the scope of the claims, since numerous modifications and variations will be apparent to those skilled in this art.

First Embodiment

In the first embodiment of the present invention, a semiconductor device of flip chip ball grid array (FCBGA) type is used as an example to describe steps and contributions of the present invention. Note that the semiconductor device of FCBGA type is used as an example, and is not intended to limit the present invention. It will be obvious to those skilled in the art to use semiconductor devices of types such as wire-bonding, TAB, BGA, non-leaded types such as QFN, or others.

Step 1

Figure 1A:
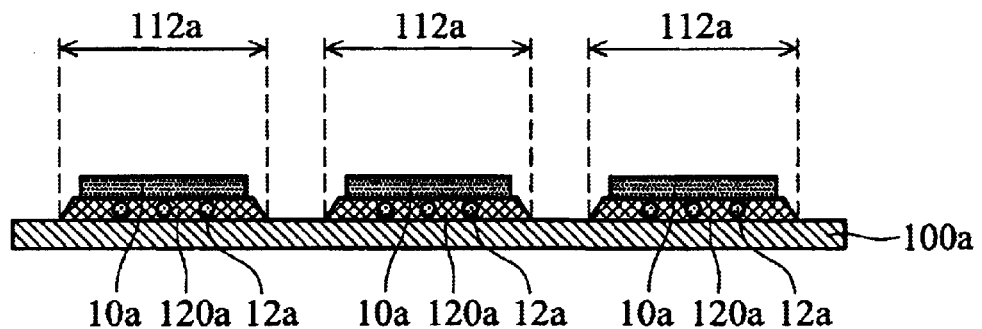
FIGS. 1A through 1C are cross-sections illustrating conventional semiconductor devices.
Figure 1B:
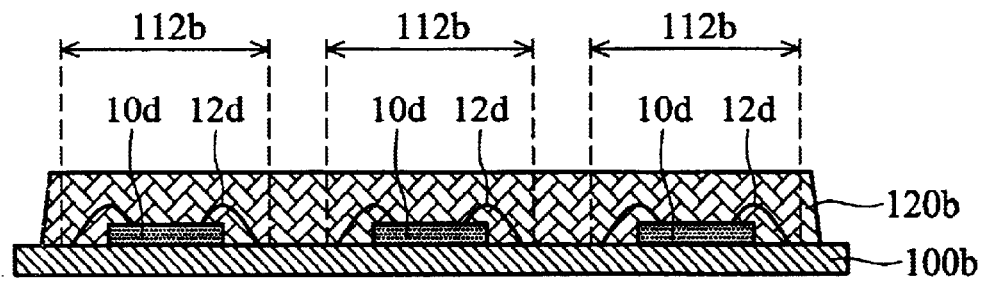
Figure 1C:
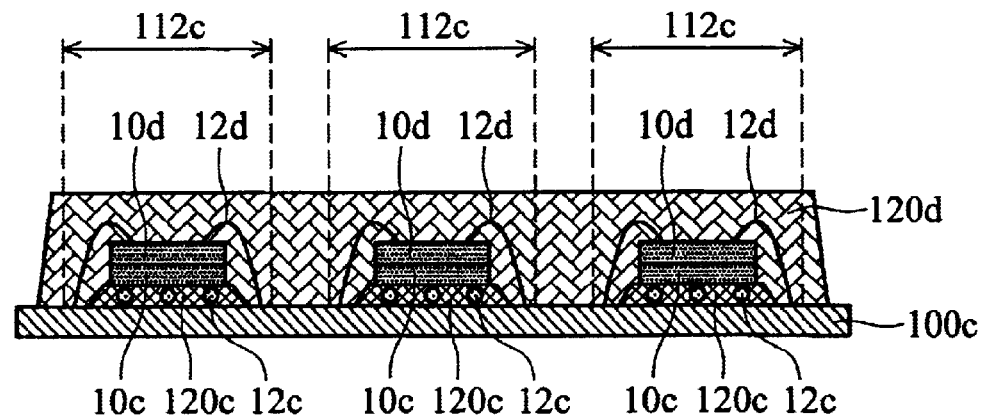
Figure 2A:
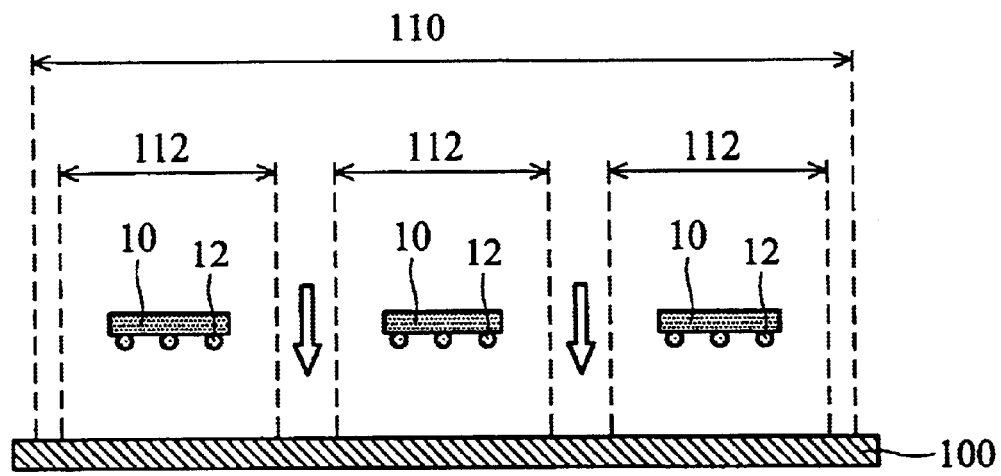
FIGS. 2A through 2J are cross-sections illustrating a method of assembling a semiconductor device forming an encapsulant in accordance with the first embodiment of the present invention.

Referring to FIG. 2A, a substrate 100, such as an organic or ceramic substrate, is provided. The substrate 100 has a predetermined encapsulation area 110, having a plurality of packaging units 112 on a surface. A top view of the surface is shown in FIG. 2B. Note that the arrangement and quantities of the packaging units 112 of the substrate 100 are used as an example, and are not intended to limit the present invention. As will be obvious to those skilled in the art, other substrates having different arrangement and quantities of packaging units will be equally suitable.

In FIG. 2A, a plurality of semiconductor chips 10, respectively having a plurality of conductive bumps 12 arranged at a predetermined pitch among each other on an active surface, is provided. The semiconductor chips 10 are respectively attached to the substrate 100, more exactly to the packaging units 112, after respectively aligning the semiconductor chips 10 and their conductive bumps 12 with each packaging unit 112. As will be obvious to those skilled in the art, other substrates having different arrangement and quantities of packaging units will be equally suitable. Equally obvious should be to preform the conductive bumps 12 on the substrate 100 rather than semiconductor chip 10.

Step 2

Figure 2C:
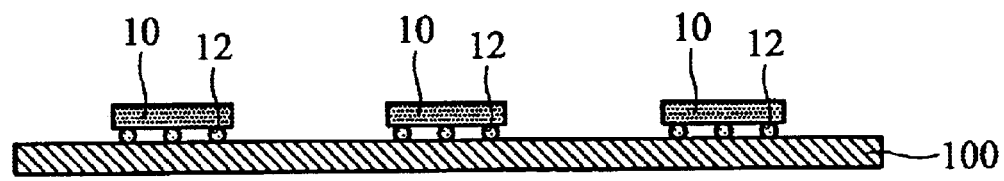
Figure 2B:
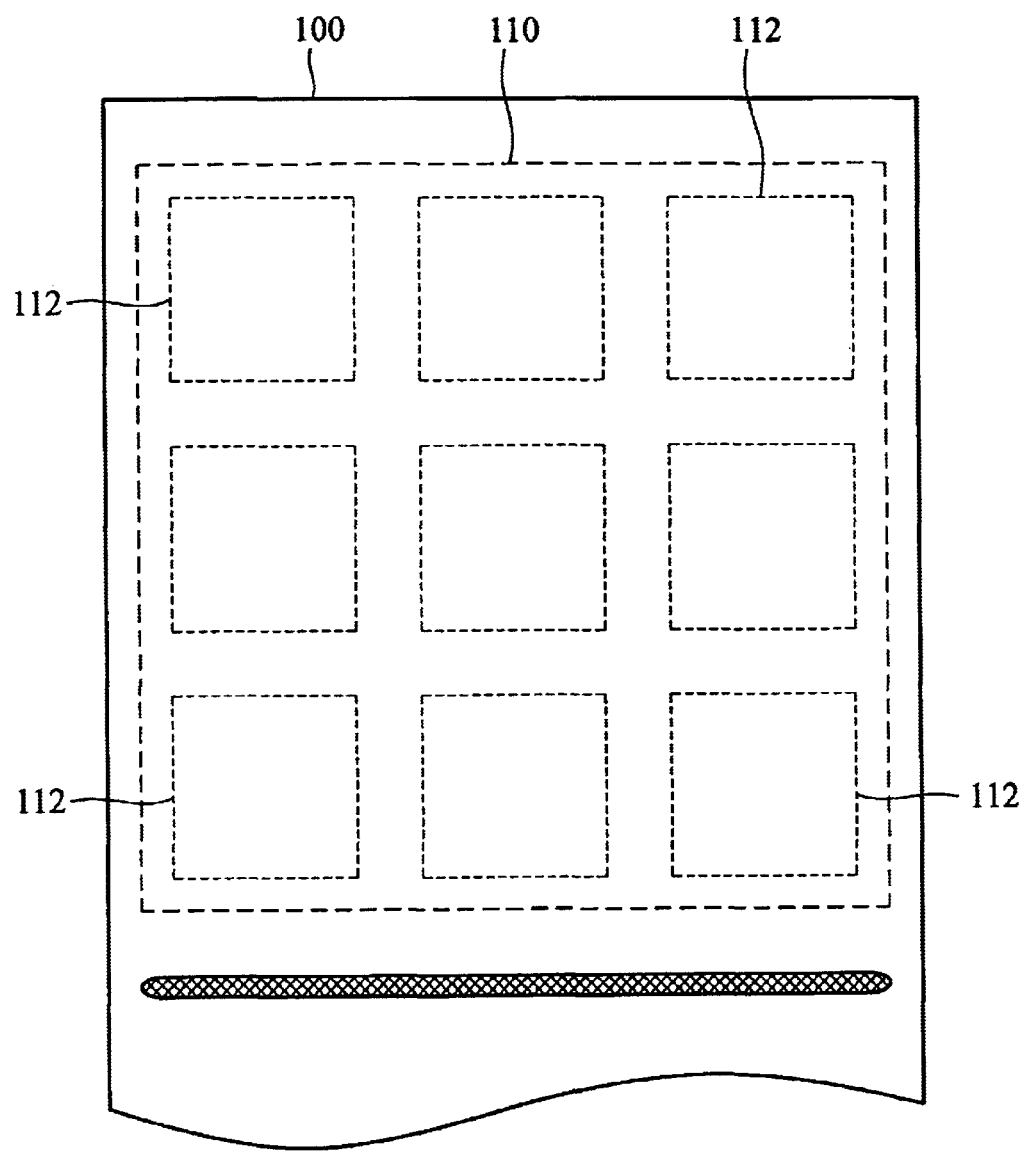

In FIG. 2C, the semiconductor chips 10 are electrically connected and fixed on the substrate 100. The fixing procedure can be such as forming a solder paste (not shown) or flux (not shown) in predetermined positions respectively in the packaging units 112, respectively aligning the semiconductor chips 10 and their conductive bumps 12 with each packaging unit 112, respectively attaching the semiconductor chips 10 to the substrate, and reflowing the conductive bumps to electrically connect and fix the semiconductor chips 10 to the substrate 100.

Step 3

Figure 2D:
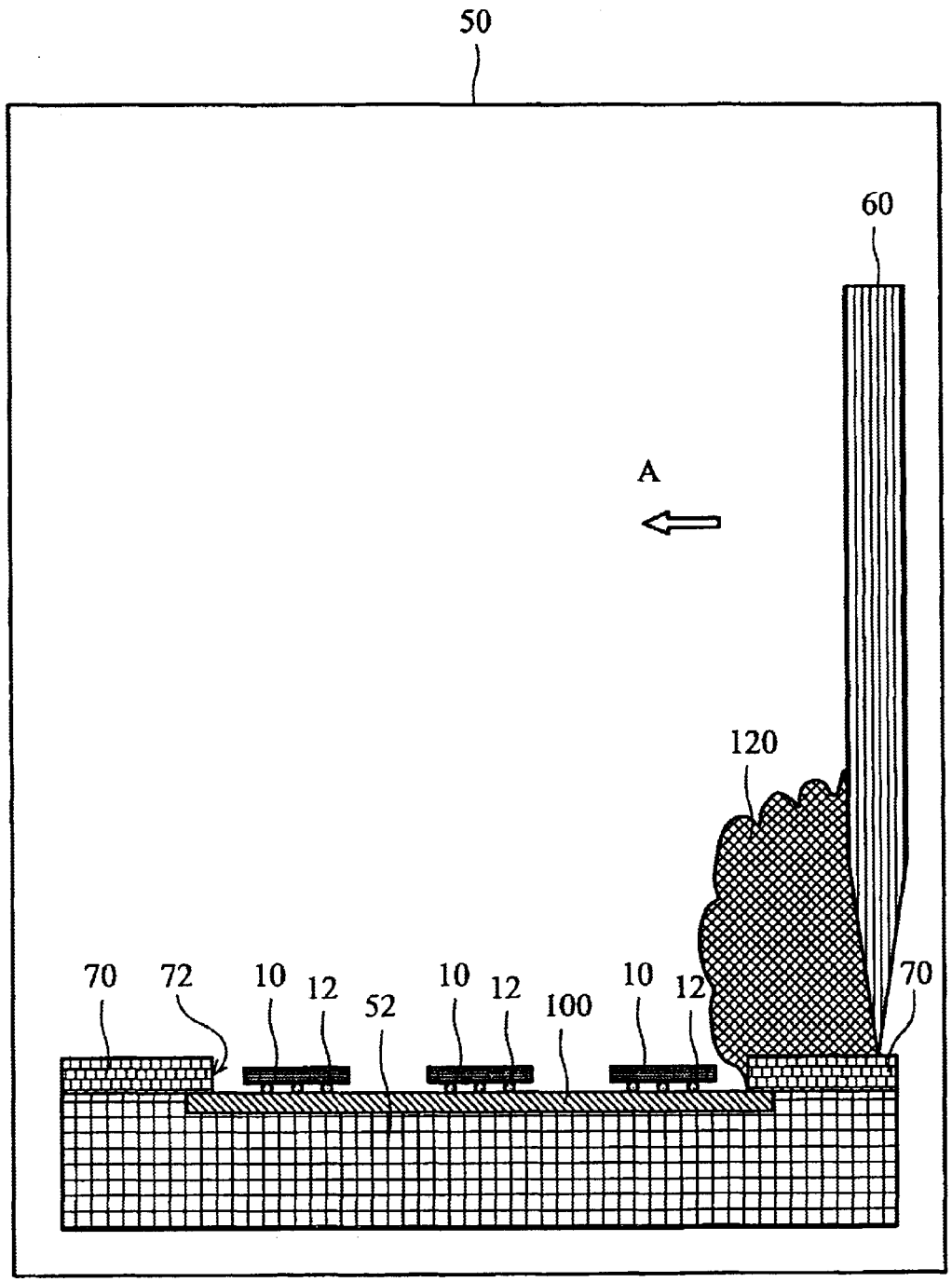

In FIG. 2D, the substrate 100 is placed on a platform 52 in an encapsulating apparatus 50. A stencil 70 is placed on the platform 52 and substrate 100, with an opening 72 exposing the predetermined encapsulation area 110. The pressure in the encapsulating apparatus 50 is set to a first air pressure, preferably between about 0.1 and 10 torr. When the pressure in the encapsulating apparatus 50 reaches the set value and stabilizes, an encapsulant 120 is formed overlying the substrate 100 by stencil printing using a wiper 60 sweeping the encapsulant 120 previously placed on the stencil 70 in direction A to form a part of the encapsulant 120 overlying the substrate 100 through the opening 72. The stencil 70 is usually metal. The thickness of the stencil 70 and the size, quantity, arrangement of the opening 72 depend on the design of the substrate 100, the size, quantity, and arrangement of the predetermined encapsulation area 110, and the thickness of encapsulant 120 to be formed overlying the substrate 100. The compositions of encapsulant 120 depend on the requirements of the semiconductor device.

Step 4

Figure 2E:
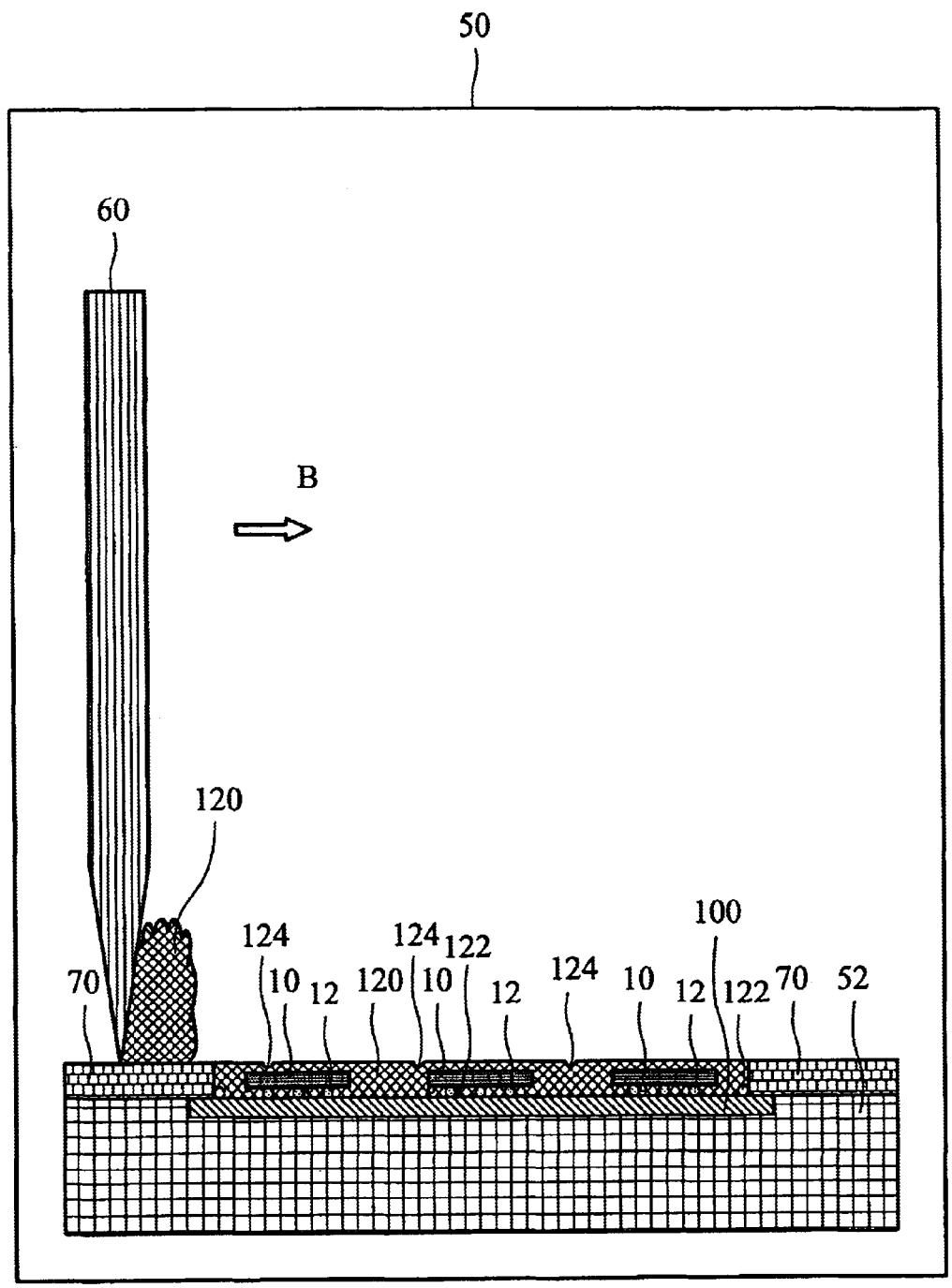

FIG. 2E shows wiper 60 and a part of encapsulant 120 on the other side of the stencil 70. Some voids 122 are formed during stencil printing in the encapsulant 120 overlying the substrate 100 such as among the conductive bumps 12. The pressure in the encapsulating apparatus 50 is then set to a second air pressure exceeding the first air pressure. When the pressure in the encapsulating apparatus 50 reaches the set value and stabilizes, voids 122 become smaller or are eliminated. Thus, some recessions 124 may appear on the surface of the encapsulant 120 overlying the substrate 100. The surface of the encapsulant 120 overlying the substrate 100 is then leveled using the wiper 60 sweeping the encapsulant 120 on the stencil 70 through the opening 72.

Further, the thickness of the encapsulant 120 overlying the substrate 100 may substantially equal the sum of the thickness of the conductive bumps 12 and the semiconductor chip 10 to expose another surface thereof. The encapsulant 120 overlying the substrate 100 may completely cover the semiconductor chips 10.

Step 5

Figure 2F:
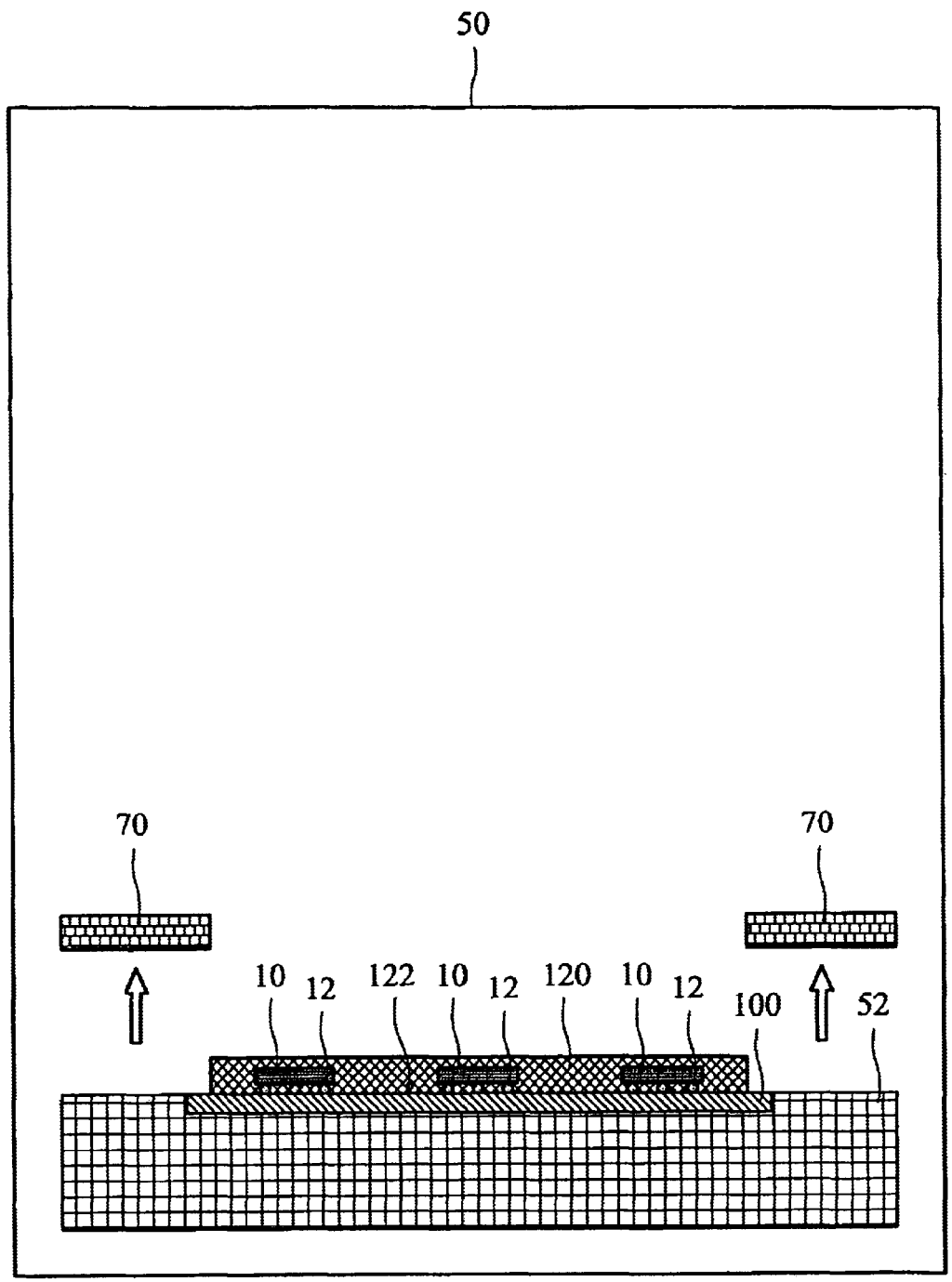

In FIG. 2F, the wiper 60 and stencil 70 are removed. At this point, most voids 122, leaving only a possible few.

Step 6

Figure 2G:
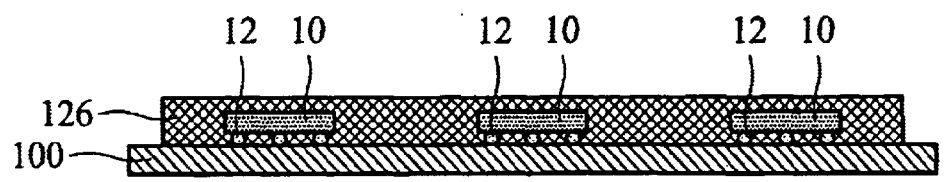

In FIG. 2G, at least one magazine (not shown) is provided to transport a plurality of substrates 100 of the same lot as needed. Next, the magazine transporting the substrates 100 is put in a pressure oven (not shown) or pressure chamber (not shown). The pressure surrounding the substrates 100 is set at a third air pressure of about 1 atm to 30 $kgf/cm^2$, preferably about 3 $kgf/cm^2$ to 15 $kgf/cm^2$, to eliminate any remaining voids 122. The atmosphere surrounding the substrates 100 is preferably dry air, nitrogen, or inert gases.

It is possible to perform an encapsulant hardening procedure when the substrates 100 are pressurized. The hardening parameters are set according to the characteristics of the encapsulant 120 so as to transfer the encapsulant 120 to a fully-cured molding compound 126 with good elasticity, air-tightness, high chemical stability, and high insulating properties.

Further, since voids 122 previously formed in the molding compound 126 are completely eliminated after application of the third air pressure, there is no reliability concern from voids in the subsequent processes.

Step 7

Figure 2H:
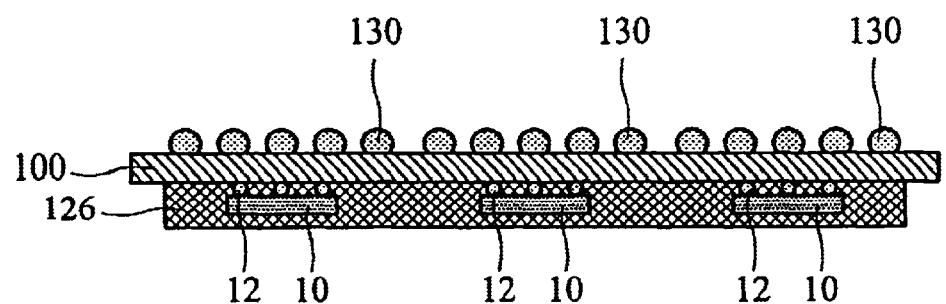

In FIG. 2H, the substrate 100 may be turned upside down as required to form a plurality of ball-like contacts 130 in predetermined positions on its other surface. The ball-like contacts 130 may be formed by solder paste (not shown) or flux (not shown) in the predetermined positions on the other surface of the substrate 100, respectively placing a solder ball (not shown) with a predetermined diameter on the solder paste or flux, or reflowing the solder balls to fasten to the substrate 100 so as to form the ball-like contacts 130.

Step 8

Figure 2I:
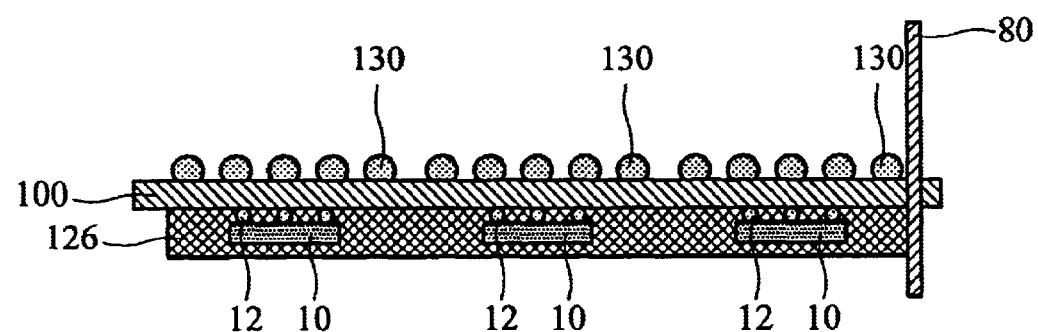
Figure 2J:
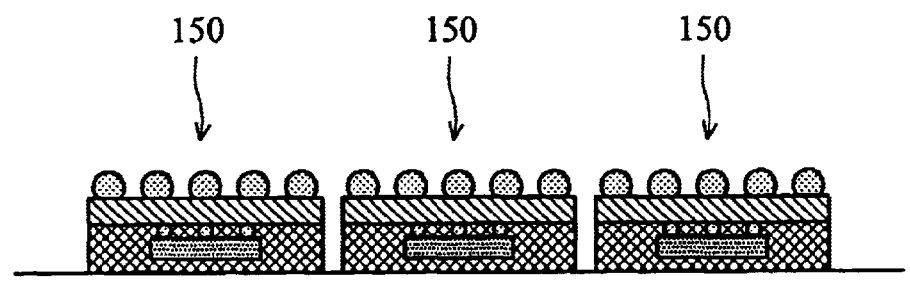

In FIG. 2I, the substrate 100 is divided according to the packaging units 112 shown in FIG. 2A using a rotating blade 80 so as to form the semiconductor devices 150 of FCBGA type shown in FIG. 2J.

Description

The step 7 in accordance with the first embodiment of the present invention will not be performed when substrate 100 is a lead-frame of QFN type.

Further, it is possible to perform an extra hardening procedure after step 6 to ensure that the molding compound 126 is completely hardened, under the same conditions as step 6 or at 1 atm, as required.

According to this embodiment, the inventive method can encapsulate a plurality of semiconductor devices at the same time, prevent voids therein, and completely cover the chip thereof during encapsulation, specifically for flip-chip types, thereby improving the throughput, production yield, reliability, and lifetime of the semiconductor device and reducing the cost of encapsulating apparatus.

Second Embodiment

In the second embodiment of the present invention, a semiconductor device of MCM type is used as an example to describe steps and contributions of the inventive method.

Step 1

Figure 3A:
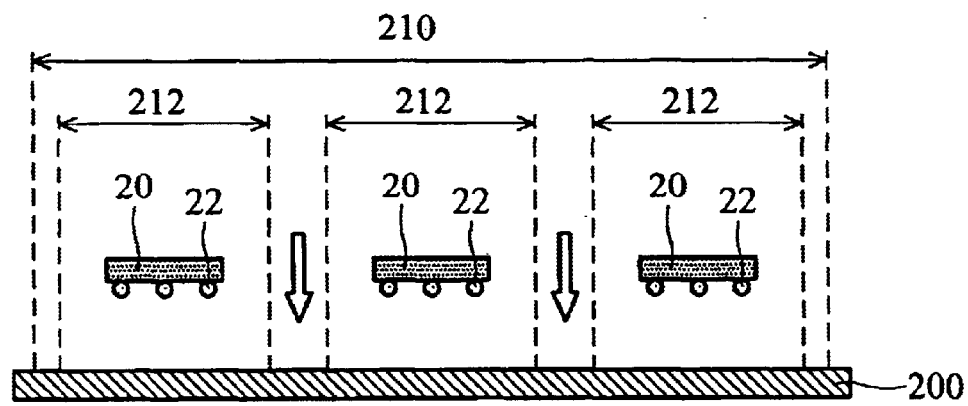
FIGS. 3A through 3K are cross-sections illustrating a method of assembling a semiconductor device forming an encapsulant in accordance with the second embodiment of the present invention.

Referring to FIG. 3A, a substrate 200, such as an organic or ceramic substrate, is provided. The substrate 200 has a predetermined encapsulation area 210, having a plurality of packaging units 212 on a surface. Top view of the surface, similar to that of the substrate 100 shown in FIG. 2B, is not shown. Note that the arrangement and quantities of the packaging units 212 of the substrate 200 is used as an example, and is not intended to limit the present invention. Equally obvious should be to provide other substrates having different arrangement and quantities of the packaging units from those of the substrate 100.

In FIG. 3A, a plurality of semiconductor chips 20, respectively having a plurality of conductive bumps 22 arranged at a predetermined pitch among each other on an active surface, is provided. The semiconductor chips 20 are respectively attached to the substrate 200, more exactly to the packaging units 212, after respectively aligning the semiconductor chips 20 and their conductive bumps 22 with each packaging unit 212. It will be obvious to those skilled in the art to provide other semiconductor chips having different arrangement and quantities of conductive bumps from those of the conductive bumps 22. Equally obvious should be to previously form the conductive bumps 22 on the substrate 200 rather than semiconductor chip 20.

Step 2

Figure 3B:
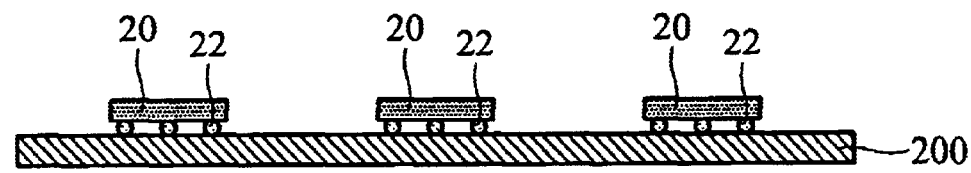

In FIG. 3B, the semiconductor chips 20 are electrically connected and fixed on the substrate 200. The fixing procedure can be such as forming a solder paste (not shown) or flux (not shown) in predetermined positions respectively in the packaging units 212, respectively aligning the semiconductor chips 20 and their conductive bumps 22 with each packaging unit 212, respectively attaching the semiconductor chips 20 to the substrate, and reflowing the conductive bumps to electrically connect and fix the semiconductor chips 20 to the substrate 200.

Step 3

Figure 3C:
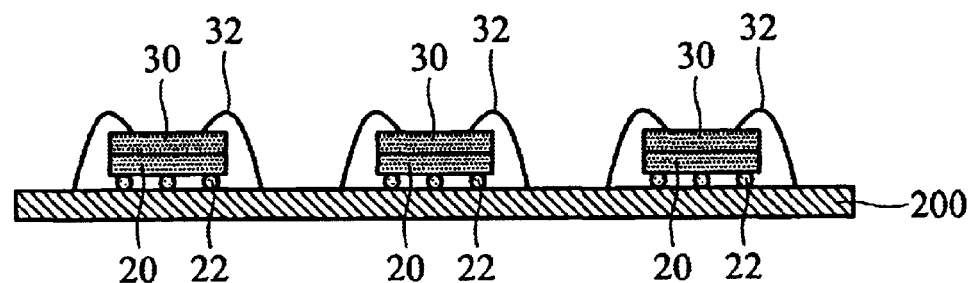

In FIG. 3C, a plurality of semiconductor chips 30 are provided. Semiconductor chips 30 are respectively attached to each semiconductor chip 20 with an active surface as the top surface. Semiconductor chips 30 are respectively electrically connected to the substrate 200 using wires 32. Wires 32 are usually Au-based alloy made by adding some microelements to adjust the physical properties of the wire 32. In some cases, wires 32 may be Al-based alloy.

It will be obvious to those skilled in the art to change to stacked-die numbers in the semiconductor device. Equally obvious should be to provide a TAB or other method rather than the wire-bonding method.

Step 4

Figure 3D:
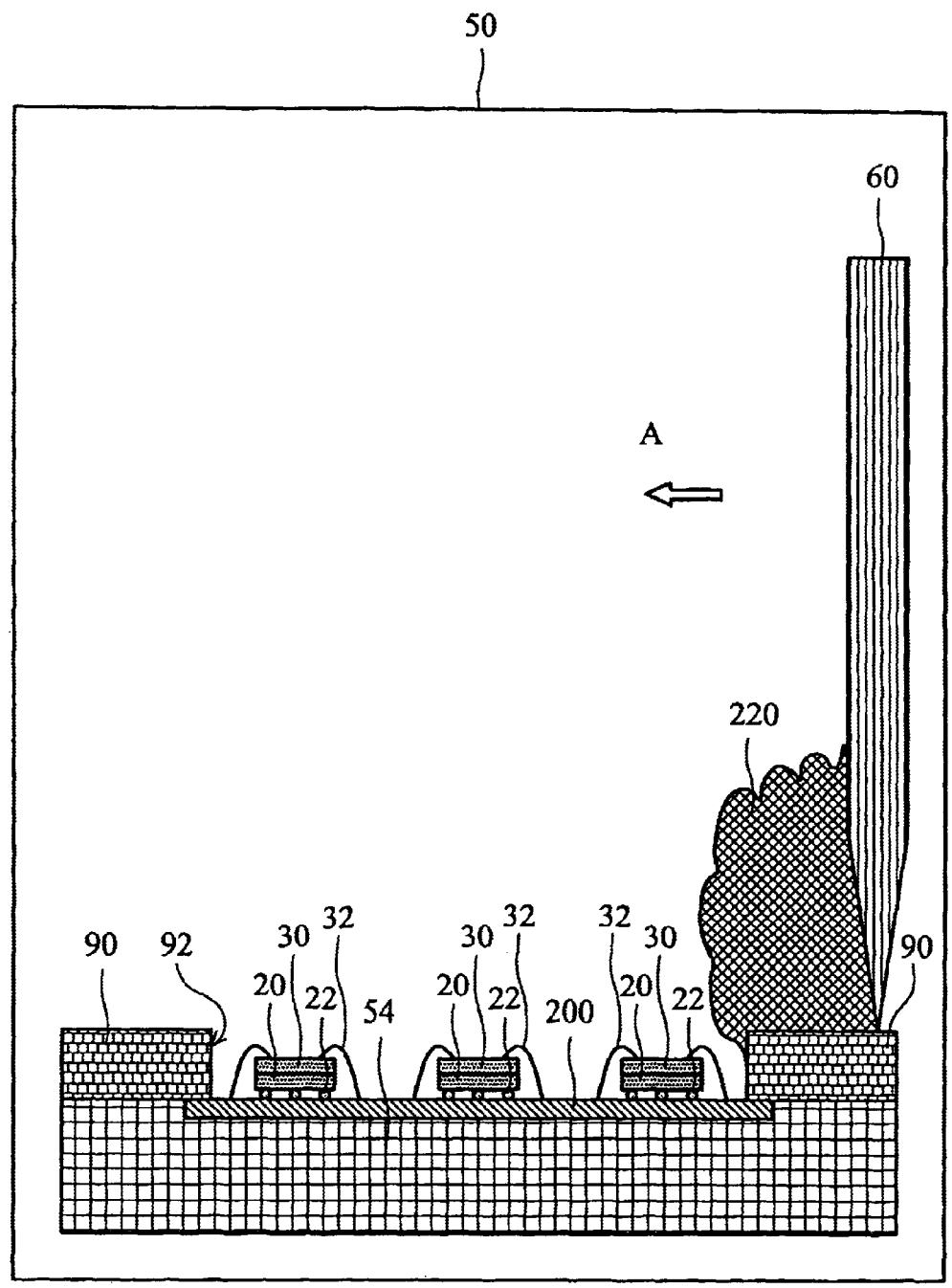

In FIG. 3D, the substrate 200 is placed on a platform 54 in an encapsulating apparatus 50. A stencil 90 is placed on the platform 54 and substrate 200, with an opening 92 exposing the predetermined encapsulation area 210. The pressure in the encapsulating apparatus 50 is set to a first air pressure, preferably between about 0.1 and 10 torr. When the pressure in the encapsulating apparatus 50 reaches the set value and stabilizes, an encapsulant 220 is formed overlying the substrate 200 by stencil printing using a wiper 60 sweeping the encapsulant 220 previously placed on the stencil 90 in direction A to form a part of the encapsulant 220 overlying the substrate 200 through the opening 92. The stencil 90 is usually metal. The thickness of the stencil 90 and the size, quantity, arrangement of the opening 92 depend on the design of the substrate 200, the size, quantity, and arrangement of the predetermined encapsulation area 210, and the thickness of encapsulant 220 to be formed overlying the substrate 200. The compositions of encapsulant 220 depend on the requirements of the semiconductor device.

Step 5

Figure 3E:
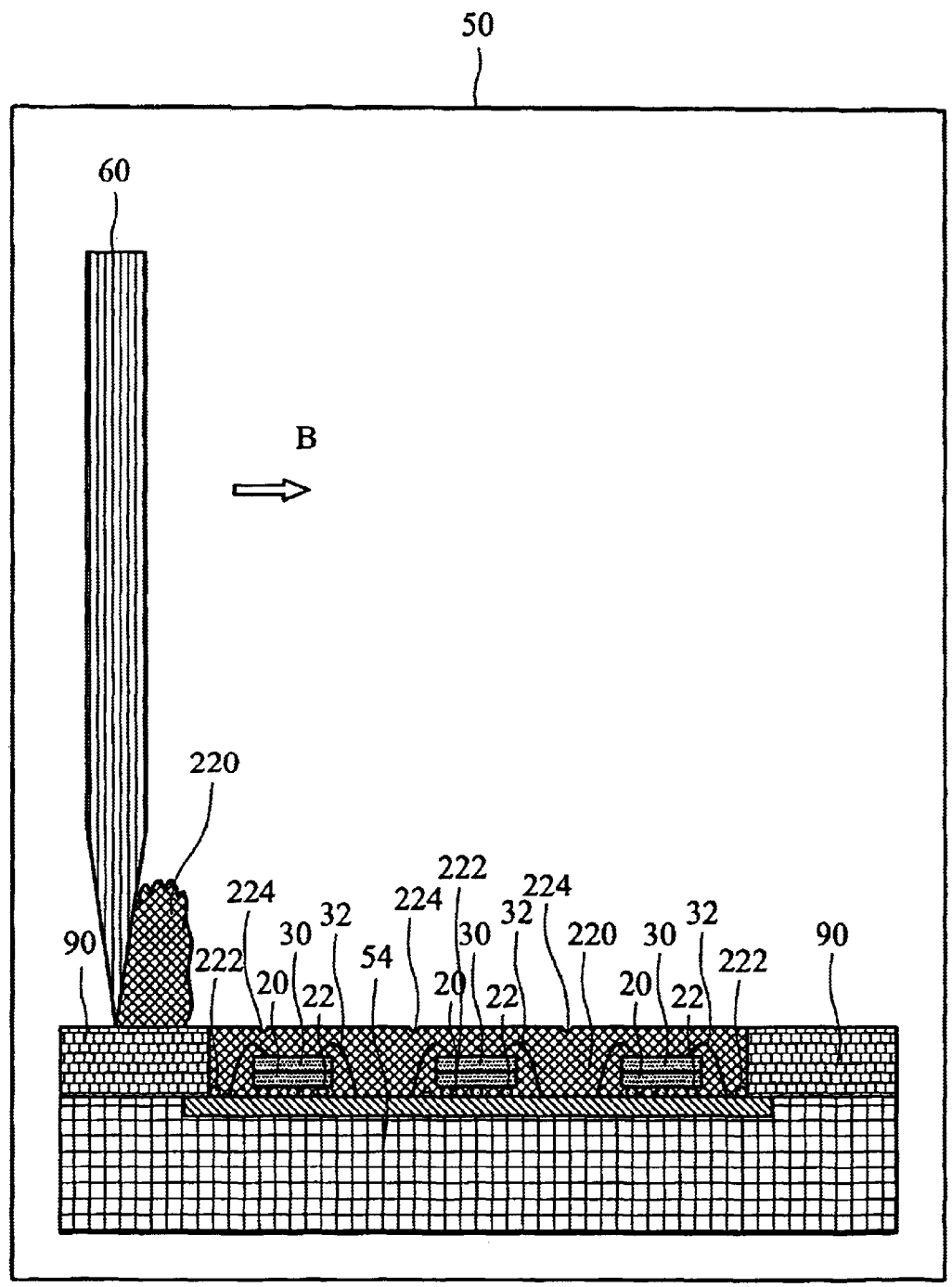

In FIG. 3E, wiper 60 and a part of encapsulant 220 are positioned on the other side of the stencil 90. Some voids 222 are formed during stencil printing in the encapsulant 220 overlying the substrate 200 such as among the conductive bumps 22. The pressure in the encapsulating apparatus 50 is then set to a second air pressure exceeding the first air pressure. When the pressure in the encapsulating apparatus 50 reaches the set value and stabilizes, voids 222 are reduced in size or eliminated. Thus, some recessions 224 appear on the surface of the encapsulant 220 overlying the substrate 200. The surface of the encapsulant 220 overlying the substrate 200 is then leveled using the wiper 60 sweeping the encapsulant 220 on the stencil 90 through the opening 92.

Further, the encapsulant 220 overlying the substrate 200 must completely cover the semiconductor chips 30 and wires 32.

Step 6

Figure 3F:
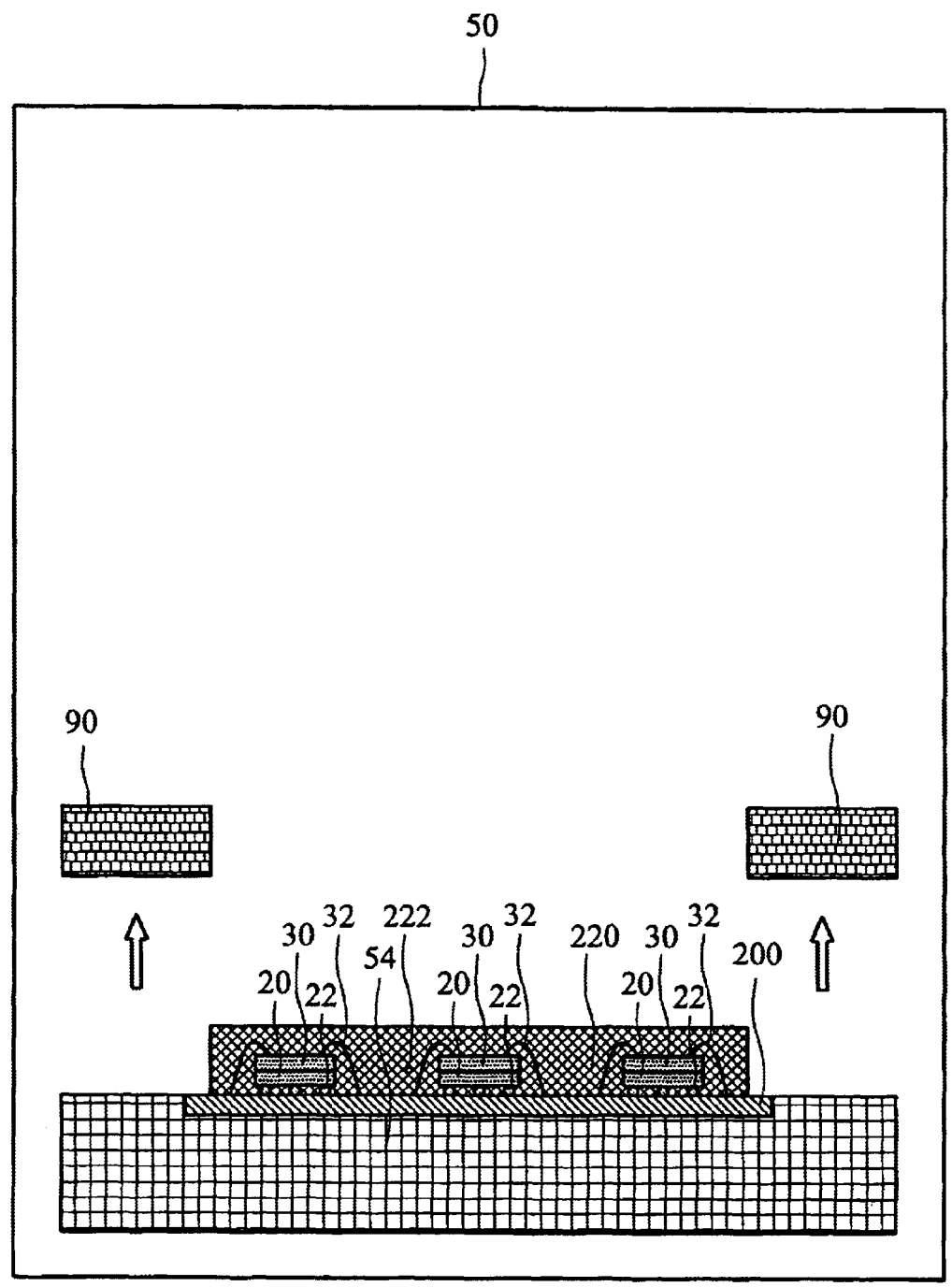

In FIG. 3F, the wiper 60 and stencil 90 are removed. Most of the voids 222 in the encapsulant 220 overlying the substrate 200 have been eliminated, leaving only a possible few.

Step 7

Figure 3G:
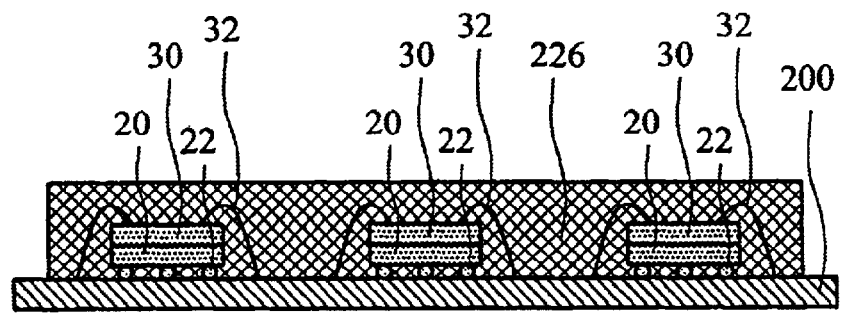

In FIG. 3G, at least one magazine (not shown) can be provided for transporting a plurality of substrates 200 of the same lot as needed. Next, the magazine transporting the substrates 200 is put in a pressure oven (not shown) or pressure chamber (not shown). The pressure surrounding the substrates 200 is set at a third air pressure about 1 atm to 30 $kgf/cm^2$, preferably about 3 $kgf/cm^2$ to 15 $kgf/cm^2$ to eliminate any possibly remaining voids 222. The atmosphere surrounding the substrates 200 is preferably dry air, nitrogen, or inert gases.

It is possible to perform an encapsulant hardening procedure when the substrates 200 are pressurized. The hardening parameters are set according to the characteristics of the encapsulant 220 so as to transfer the encapsulant 220 to a molding compound 226 with good elasticity, air-tightness, high chemical stability, and high insulating properties.

Further, since any voids 222 in the molding compound 226 are completely eliminated after application of the third air pressure, there is no reliability concern in the subsequent processes resulting therefrom.

Step 8

Figure 3H:
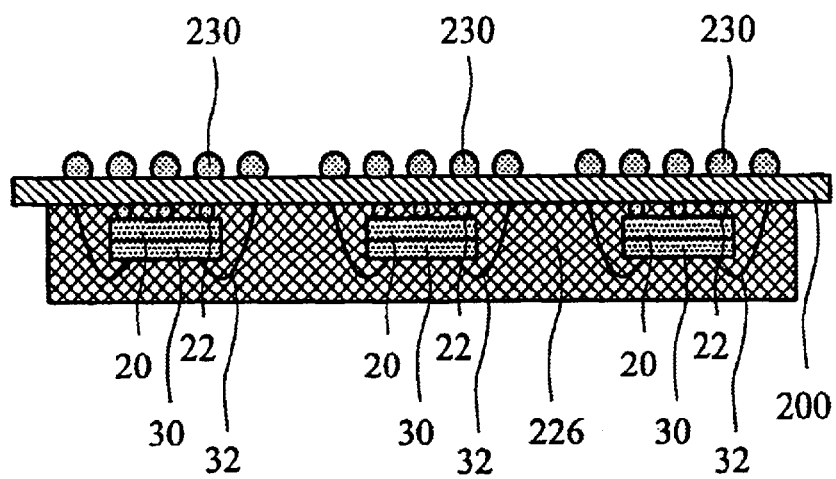

In FIG. 3H, the substrate 200 can be turned upside down as required to form a plurality of ball-like contacts 230 in predetermined positions on the other surface of the substrate 200. The ball-like contacts 230 may be formed by a solder paste (not shown) or flux (not shown) in the predetermined positions on the other surface of the substrate 200, respectively placing a solder ball (not shown) with a predetermined diameter on the solder paste or flux, or reflowing the solder balls to fasten the solder balls to the substrate 200 so as to form the ball-like contacts 230.

Step 9

Figure 3I:
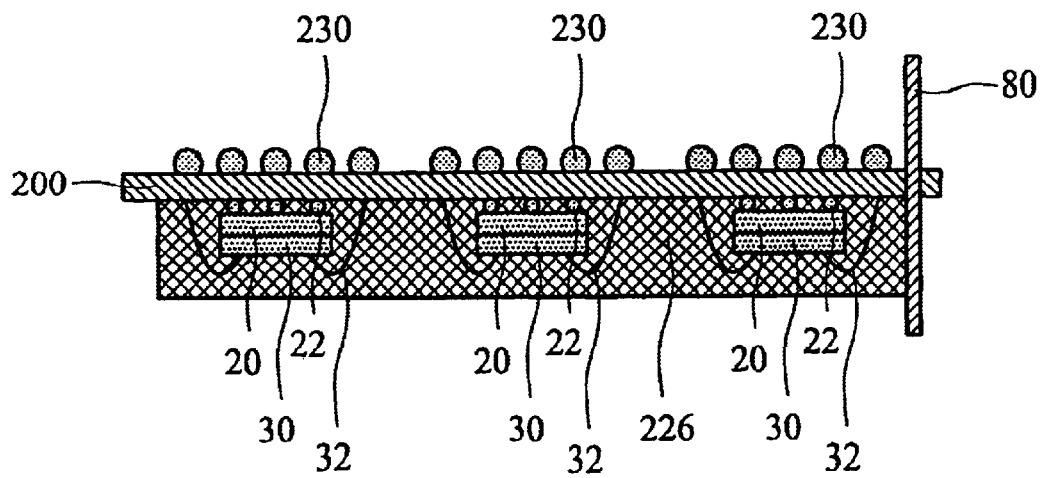
Figure 3J:
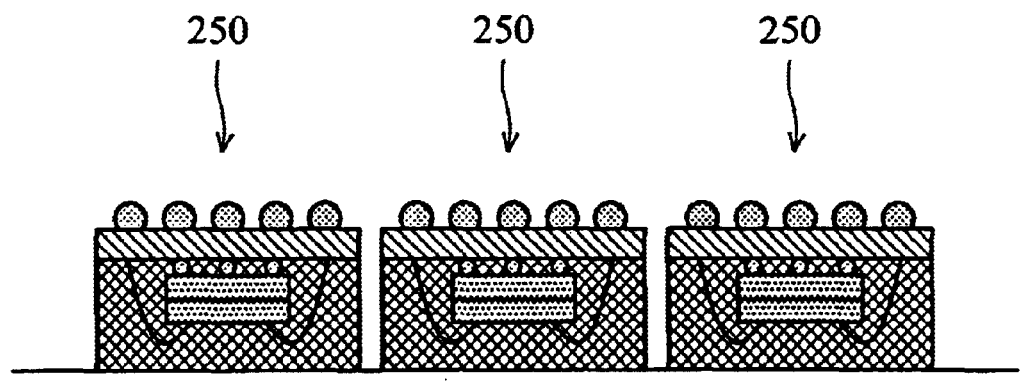

In FIG. 3I, the substrate 200 is divided according to the packaging units 112 shown in FIG. 3A using a rotating blade 80 so as to form the semiconductor devices 250 of MCM type shown in FIG. 3J.

Description

Step 8 of this embodiment will not be performed when substrate 200 is a lead-frame of QFN type.

Further, it is possible to perform an extra hardening procedure after step 7 to ensure that the molding compound 226 is completely hardened. The extra hardening procedure may be performed under the same conditions as step 7 or at 1 atm as required.

Figure 3K:
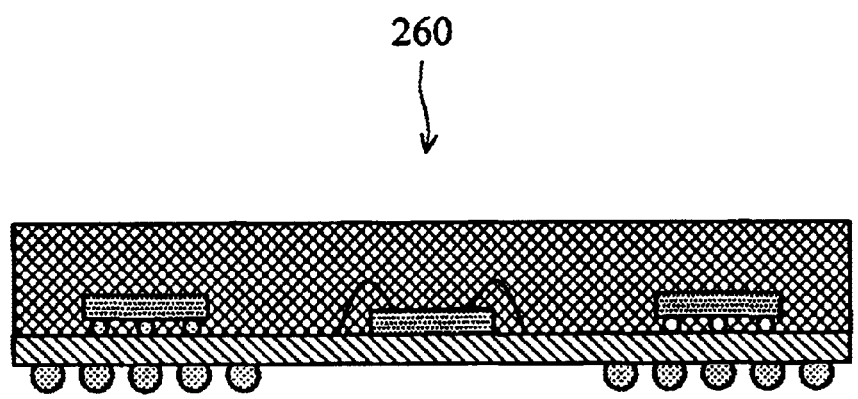

The semiconductor device of MCM type may not only be semiconductor devices 250 formed using stacked-die technology, but as the semiconductor device 260 without stacked die shown in FIG. 3K. It will be obvious to those skilled in the art to design a semiconductor chip with both stacked and unstacked dies.

According to this embodiment, the inventive method can encapsulate a plurality of semiconductor devices at the same time, prevent voids therein, and completely cover the chip thereof during encapsulation, specifically for flip-chip types, thereby improving the throughput, production yield, reliability, and lifetime of the semiconductor device and reducing the cost of encapsulating apparatus.

According to the first and second embodiments of the present invention, the method of assembling a semiconductor device forming an encapsulant according to the present invention achieves all desired objects of the present invention.

WORKING EXAMPLES

In the subsequent working examples, three sets of semiconductor devices of FCBGA type are fabricated to demonstrate that the inventive method effectively prevents voids in the molding compound of semiconductor devices, including devices of flip chip type and wire-bonding, TAB, or other designs.

The fabrication steps of the subsequent working example all follow the steps of the first embodiment because semiconductor devices of FCBGA type are fabricated therein. Examples 1 and 2 are experimental groups, following the first embodiment. Example 3 is a reference group, not completely following the first embodiment. The parameters used in Examples 1 and 2 represent all possible parameters, rather than acting as a limitation. Those skilled in the art will be able to make modifications as required.

Example 1

A first substrate, having a predetermined encapsulation area of approximately 40 mm×40 mm, having nine packaging units arranged in a 3×3 array, was provided. Steps were performed from the first embodiment. In step 3, the stencil opening was approximately 40 mm×40 mm, and the thickness of the stencil approximately 0.8 mm. The provided encapsulant was CV-5400A from Matsushita Electric Works Co. (MEW), with viscosity of approximately 120 Pa.S. The first substrate underwent stencil printing at an air pressure of approximately 0.7 torr, using a Teflon wiper. Before performing step 7, void location and distribution in the encapsulant overlying the first substrate were recorded. In step 7, the first substrate was put in a pressure oven at an air pressure approximately 5 kgf/cm² in an atmosphere of dry air. The first substrate was further heated to approximately 100° C. for approximately 1 hour to perform the first hardening procedure during pressurization. After the first hardening procedure, the first substrate was moved to a general oven at 1 atm to be heated to approximately 150° C. for approximately 3 hours to perform the second hardening procedure. Void location and distribution were again checked.

Example 2

A second substrate, having a predetermined encapsulation area of approximately 40 mm×40 mm, having nine packaging units arranged in a 3×3 array, was provided. Steps were performed from the first embodiment. In step 3, the stencil opening was approximately 40 mm×40 mm, and thickness of the stencil approximately 0.8 mm. The provided encapsulant was CV-351A from MEW, with viscosity of approximately 30 Pa.S. The second substrate underwent stencil printing at air pressure of approximately 0.7 torr, using a Teflon wiper. Before performing step 7, void location and distribution in the encapsulant overlying the second substrate were recorded. In step 7, the second substrate was put in a pressure oven at an air pressure of approximately 5 kgf/cm² in an atmosphere of dry air. The second substrate was further heated to approximately 100° C. for approximately 1 hour to perform the first hardening procedure during pressurization. After the first hardening procedure, the second substrate was moved to a general oven at 1 atm to be heated to approximately 150° C. for approximately 3 hours to perform the second hardening procedure. Void location and distribution were again checked.

Example 3

A third substrate, having a predetermined encapsulation area of approximately 40 mm×40mm, having nine packaging units arranged in a 3×3 array, was provided. Steps were performed from the first embodiment. In step 3, the stencil opening was approximately 40 mm×40 mm, and the thickness of the stencil approximately 0.8 mm. The provided encapsulant was CV-5351A from MEW, with viscosity of approximately 30 Pa.S. The third substrate underwent stencil printing at an air pressure of approximately 0.7 torr, using a Teflon wiper. Before performing step 7, void location and distribution in the encapsulant overlying the third substrate were recorded. In step 7, the third substrate was put in a general oven at 1 atm to be heated to approximately 100° C. for approximately 1 hour to perform the first hardening procedure, and then to approximately 150° C. for approximately 3 hours to perform the second hardening procedure. Void location and distribution were again checked.

Description

Figure 4A:
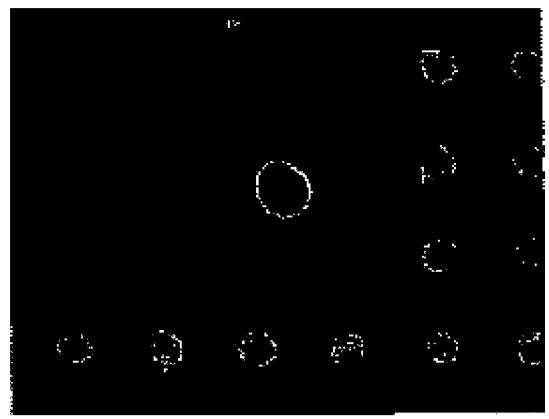
FIGS. 4A and 4B are photographs illustrating experimental results from example 1 of the working examples described.
Figure 4B:
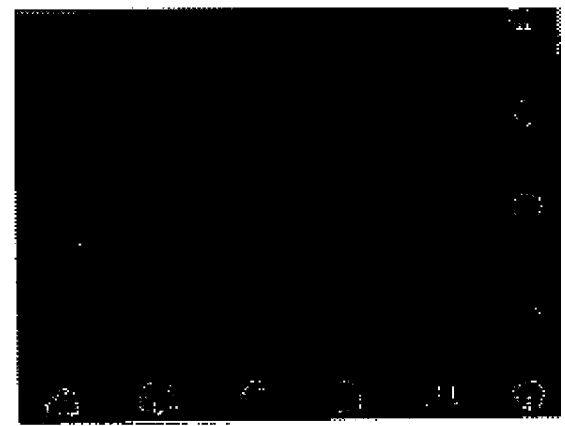

FIGS. 4A and 4B are photographs illustrating experimental results from example 1 of the working examples described. FIG. 4A shows a void before performing step 7, and FIG. 4B shows the same void eliminated thereafter, proving that the inventive method effectively prevents voids in the molding compound of semiconductor devices.

Figure 5A:
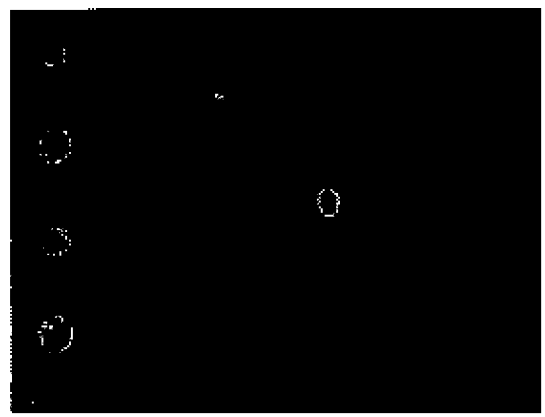
FIGS. 5A and 5B are photographs illustrating experimental results from example 2 of the working examples described.
Figure 5B:

FIGS. 5A and 5B are photographs illustrating experimental results from example 2 of the working examples described. The difference between examples 1 and 2 is the encapsulant used therein. That used in example 1 has viscosity of 120 Pa.S, exceeding that of example 2 with a viscosity of 30 Pa.S. FIG. 5A shows a void before performing step 7, smaller than that recorded in FIG. 4A, and FIG. 5B shows the same void eliminated thereafter, successfully proving that the inventive method effectively prevents voids in the molding compound of semiconductor devices.

Figure 6:
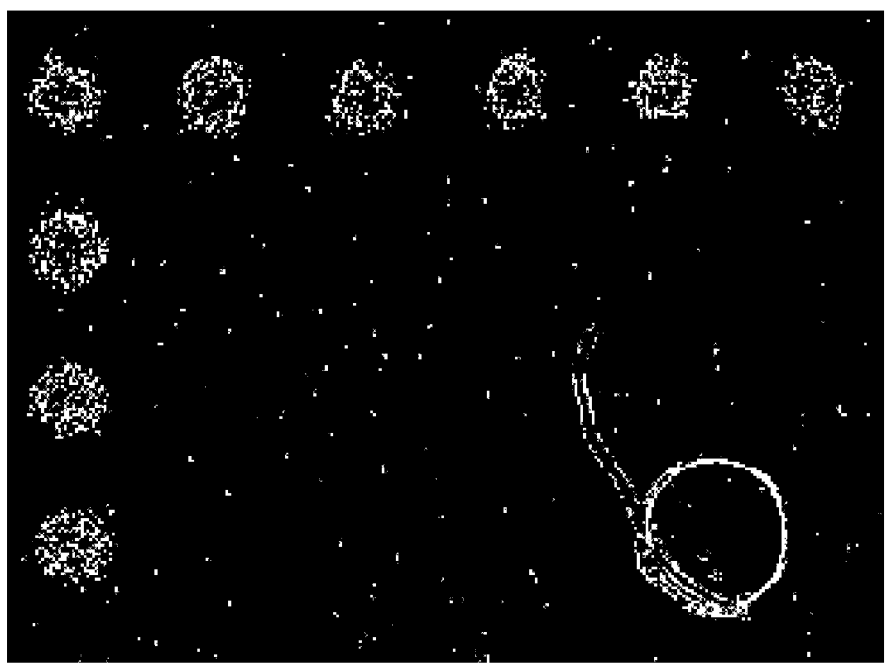
FIG. 6 is a photograph illustrating experimental results from example 3 of the working examples described.

FIG. 6 is a photograph illustrating experimental results from example 3 of the working examples described. The difference between examples 3 and 1 is that the encapsulant overlying the third substrate of example 3 is not pressurized as in the first embodiment. The voids recorded before step 7 are not substantially improved after step 7, remaining in the hardened molding compound overlying the third substrate.

As mentioned, the results from the working examples prove efficacy of the inventive method at effectively preventing voids in molding compound of semiconductor devices, thereby achieving the desired objects of the present invention.

Although the present invention has been particularly shown and described with reference to the preferred specific embodiments and examples, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of assembling a semiconductor device forming an encapsulant, comprising:

providing a substrate, having a plurality of semiconductor devices respectively having semiconductor chips electrically connected to a predetermined encapsulation area on a surface of the substrate;

filling an encapsulant overlying the predetermined encapsulation area using stencil printing, and sweeping excess encapsulant over the predetermined encapsulation area at a first air pressure less than approximately 1 atm;

sweeping excess encapsulant from the predetermined encapsulation area over the encapsulant overlying the predetermined encapsulation area using stencil printing at a second air pressure exceeding the first air pressure; and hardening the encapsulant at a third air pressure exceeding approximately 1 atm.

2. The method as claimed in claim 1, wherein each semiconductor chip electrically connects to the substrate using flip chip technology, using a plurality of conductive bumps, arranged at a predetermined pitch among each other between each semiconductor chip and the substrate.

3. The method as claimed in claim 1, wherein the encapsulant overlying the predetermined encapsulation area completely covers the semiconductor chips.

4. The method as claimed in claim 2, wherein the encapsulant overlying the predetermined encapsulation area further fills the areas between each semiconductor chip and the substrate, and among the conductive bumps.

5. The method as claimed in claim 2, wherein the thickness of the encapsulant overlying the predetermined encapsulation area is as large as the sum of the thickness of the conductive bump and that of the semiconductor chip or exceeding.

6. The method as claimed in claim 1, wherein the first air pressure is about 0.1 to 10 torr.

7. The method as claimed in claim 1, wherein the third air pressure is as large as 30 kgf/cm$^2$ or below.

8. The method as claimed in claim 1, wherein the third air pressure is about 3 kgf/cm$^2$ to 15 kgf/cm$^2$.

9. The method as claimed-in claim 1, wherein the third air pressure is provided by dry air, nitrogen, or inert gases.

10. A method of assembling a semiconductor device, comprising:

providing a substrate and a plurality of semiconductor chips, the substrate having a predetermined encapsulation area, and a plurality of packaging units, on a surface;

respectively attaching the semiconductor chips to the packaging units, the semiconductor chips respectively electrically connecting to the substrate;

filling an encapsulant overlying the predetermined encapsulation area using stencil printing, sweeping an excess of the encapsulant over the predetermined encapsulation area at a first air pressure below approximately 1 atm;

sweeping excess encapsulant from the predetermined encapsulation area over the encapsulant overlying the predetermined encapsulation area using stencil printing at a second air pressure above the first air pressure;

performing a first hardening step to harden the encapsulant at a third air pressure above approximately 1 atm; and dividing the substrate into a plurality of semiconductor devices according to the packaging units.

11. The method as claimed in claim 10, wherein each semiconductor chip electrically connects to the substrate using flip chip technology, using a plurality of conductive bumps, arranged at a predetermined pitch among each other between each semiconductor chip and the substrate.

12. The method as claimed in claim 10, wherein the encapsulant overlying the predetermined encapsulation area completely covers the semiconductor chips.

13. The method as claimed in claim 11, wherein the encapsulant overlying the predetermined encapsulation area further fills the area between each semiconductor chip and the substrate, and among the conductive bumps.

14. The method as claimed in claim 11, wherein the thickness of the encapsulant overlying the predetermined encapsulation area is as large as the sum of the thickness of the conductive bump and that of the semiconductor chip or above.

15. The method as claimed in claim 10, wherein the first air pressure is about 0.1 torr to 10 torrs.

16. The method as claimed in claim 10, wherein the third air pressure is as large as 30 kgf/cm$^2$ or below.

17. The method as claimed in claim 10, wherein the third air pressure is about 3 kgf/cm$^2$ to 15 kgf/cm$^2$.

18. The method as claimed in claim 10, wherein the third air pressure is provided by dry air, nitrogen, or inert gases.

19. The method as claimed in claim 10, further comprising performing a second hardening step to completely harden the encapsulant.

20. The method as claimed in claim 10, further comprising forming a plurality of leads or connecting balls overlying the semiconductor devices.

* * * * *

UNITED STATES PATENT AND TRADEMARK OFFICE
CERTIFICATE OF CORRECTION

PATENT NO.        : 6,821,818 B2                                      Page 1 of 1
APPLICATION NO. : 10/619334
DATED             : November 23, 2004
INVENTOR(S)       : Kai-Chi Chen et al.

It is certified that error appears in the above-identified patent and that said Letters Patent is hereby corrected as shown below:

On the title page change the listing of the Inventors item (75) of the Patent to:

Kai-Chi Chen, Nantou (TW); Hsun-Tien Li, Hsinchu (TW); Shu-Chen Huang, Keelung (TW); Tzong-Ming Lee, Hsinchu (TW)

Signed and Sealed this

Twenty-sixth Day of December, 2006

JON W. DUDAS
*Director of the United States Patent and Trademark Office*